(12) United States Patent
Uchida et al.

(10) Patent No.: US 8,681,480 B2
(45) Date of Patent: Mar. 25, 2014

(54) INTERNAL CIRCUIT STRUCTURAL ELEMENT FOR ELECTRICAL CONNECTION BOX AND ELECTRICAL CONNECTION BOX USING THE SAME

(75) Inventors: Kunihiro Uchida, Yokkaichi (JP); Yoshihisa Shimada, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 179 days.

(21) Appl. No.: 13/236,193

(22) Filed: Sep. 19, 2011

(65) Prior Publication Data

US 2012/0200988 A1  Aug. 9, 2012

(30) Foreign Application Priority Data

Feb. 8, 2011 (JP) .................................. 2011-024893

(51) Int. Cl.
*H02B 1/48* (2006.01)
(52) U.S. Cl.
USPC ............. 361/624; 361/627; 361/752; 174/50; 174/68.2; 439/76.2
(58) Field of Classification Search
USPC ............ 361/624, 637, 752; 439/76.2; 174/50, 174/68.2, 72 B
See application file for complete search history.

(56) References Cited

U.S. PATENT DOCUMENTS

| | | | | |
|---|---|---|---|---|
| 5,764,487 | A * | 6/1998 | Natsume | 361/775 |
| 5,928,004 | A * | 7/1999 | Sumida et al. | 439/76.2 |
| 6,512,187 | B2 * | 1/2003 | Sumida et al. | 174/261 |
| 6,914,765 | B2 | 7/2005 | Nakamura et al. | |
| 7,207,827 | B2 * | 4/2007 | Saka | 439/395 |
| 7,249,956 | B2 * | 7/2007 | Ishiguro et al. | 439/76.2 |
| 7,549,873 | B2 * | 6/2009 | Hayakawa et al. | 439/76.2 |
| 2009/0020332 | A1 * | 1/2009 | Sano | 174/88 R |

FOREIGN PATENT DOCUMENTS

JP    A 2003-9350    1/2003

* cited by examiner

*Primary Examiner* — Hoa C Nguyen
*Assistant Examiner* — Paresh Paghadal
(74) *Attorney, Agent, or Firm* — Oliff PLC

(57) ABSTRACT

An internal circuit structural element including a bus bar circuit structural element formed by a bus bar having a selectively cuttable portion that is formed into different types of routing configurations as a bus bar circuit by selectively cutting the portion, and a printed wire circuit structural element formed by a printed-circuit board having a selective energization portion obtained by dividing a printed wire that is formed into different types of routing configurations as a printed wire circuit by selectively attaching a jumper member that bridges across a divided portion of the printed wire to the selective energization portion.

4 Claims, 9 Drawing Sheets

INTERNAL CIRCUIT STRUCTURAL ELEMENT FOR ELECTRICAL CONNECTION BOX AND ELECTRICAL CONNECTION BOX USING THE SAME

CROSS-REFERENCE TO RELATED APPLICATION

This application claims priority to JP 2011-024893 filed in Japan on Feb. 8, 2011, the entirety of which is incorporated herein by reference.

BACKGROUND

The exemplary embodiments described herein relate generally to an internal circuit structural element for an electrical connection box that can form an internal circuit of an electrical connection box incorporated into, for example, an automobile or the like, and more particularly, to an internal circuit structural element for an electrical connection box having an internal circuit that includes a bus bar circuit and a printed wire circuit.

An electrical connection box, for example a junction box or the like, has been employed in a vehicle, such as an automobile, to efficiently distribute a power supply from a battery to respective electrical components. In such an electrical connection box, there can be an electrical connection box having an internal circuit that includes a bus bar circuit and a printed wire circuit of a printed-circuit board.

An internal circuit of the electrical connection box can require different types of circuit configurations to suit vehicles of different types and grades. In order to reduce manufacturing costs, different types of bus bars are can be prepared for standardized printed-circuit boards such that bus bars can be changed to fit a circuit configuration. Further, to make an internal circuit more readily fit different types of circuit configurations at a lower cost, JP-A-2003-9350, for example, describes a technique of achieving different types of circuit configurations by standardizing bus bars and cutting an energization path of a bus bar at different positions.

SUMMARY

However, because a bus bar is a wide member, it can be difficult to wire route a large number of bus bars in a limited space. Accordingly, in order to achieve a complex configuration, bus bars are typically laminated in multiple layers by interposing insulating plates. Disadvantageously, this can result in an increased size and weight of the electrical connection box. In addition, because bus bars are formed by punching out a metal plate using a die, the basic configurations are generally the same and limited. It is therefore difficult to achieve a wider variety of circuit configurations with the technique of achieving different types of configurations by cutting an energization path at different positions as described in the reference document cited above.

In certain aspects, the exemplary embodiments described herein provide an internal circuit structural element for an electrical connection box having an internal circuit that includes a bus bar circuit and a printed wire circuit. The exemplary embodiments provided can be readily adaptable to achieve more complex and a wider variety of internal circuits while standardizing bus bars and printed-circuit boards, and can be used to provide an electrical connection box.

According to one embodiment, an internal circuit structural element for an electrical connection box can be an internal circuit structural element for an electrical connection box having an internal circuit that includes a bus bar circuit and a printed wire circuit of a printed-circuit board. The internal circuit structural element can include a bus bar circuit structural element formed of a bus bar having a cuttable portion that can be formed into different types of routing configurations as the bus bar circuit by selectively cutting the cuttable portion, and a printed wire circuit structural element formed of a printed-circuit board having a selective energization portion obtained by dividing a printed wire that can be formed into different types of routing configurations as the printed wire circuit by selectively attaching a jumper member that bridges across a divided portion of the printed wire to the selective energization portion.

When the internal circuit structural element for an electrical connection box is configured in this manner, by selecting whether the cuttable portion provided to the bus bar is cut or left uncut, it is possible to form different types of bus bar circuits from the same bus bar. Further, by selecting whether the jumper member is attached or unattached to the selective energization portion provided on the printed-circuit board, it becomes possible to form different types of printed wire circuits from the same printed-circuit board. Thus, it is possible to form different types of routing configurations for each of the bus bar circuit and the printed wire circuit. Hence, by combining different types of bus bar circuits and different types of the printed wire circuits, it is possible to provide more complex and a wider variety of internal circuits in a cost-effective manner and while standardizing bus bars and printed-circuit boards.

In particular, by providing the selective energization portion on the printed-circuit board, it is possible to change the circuit configuration of the printed wire circuit depending on whether the jumper member is attached or unattached to the selective energization portion. Because it is easier to change the circuit configuration of the printed wire circuit than the bus bar, the circuit configuration can be changed with a more simple process than a case where different types of circuit configurations are achieved using the bus bar alone. It is thus possible to form a wider variety of internal circuits while reducing manufacturing costs.

It may be sufficient in certain embodiments to provide at least one selectively cuttable portion on the bus bar and one selective energization portion on the printed-circuit board. For example, two types of bus bar circuits can be formed by selecting whether one selectively cuttable portion is cut or left uncut. Also, two types of printed wire circuits can be formed by selecting whether the jumper member is attached or unattached to one selective energization portion.

The internal circuit structural element configured as described above can be included in an electrical connection box having an internal circuit that includes a bus bar circuit and a printed wire circuit of a printed-circuit board. The bus bar circuit can be formed by selectively cutting the selectively cuttable portion of the bus bar circuit structural element. The printed wire circuit can be formed by selectively attaching the jumper member to the selective energization portion of the printed wire circuit structural element.

When the electrical connection box is configured in this manner, because the internal circuit structural element for an electrical connection box configured as described above is used, it is possible to form different types of bus bar circuits and different types of printed wire circuits in a cost-effective manner. Hence, a wide variety of internal circuits can be formed in a cost-effective manner.

In another embodiment, the electrical connection box can be configured in such a manner that the jumper member may be provided with a pair of conducting portions that are respectively connected to terminals at both ends of the cut portion of the printed wire in the selective energization portion and a radiator plate portion of a plate shape.

When configured in this manner, it is possible to provide the jumper member with a heat dissipation function. Accordingly, even in a case where a circuit for relatively large current is formed using a bus bar circuit using a printed wire circuit, it is possible to ensure that heat dissipation occurs because of the jumper member, thereby advantageously reducing thermal influences on the printed wire circuit.

According to a further embodiment, the electrical connection box can be configured in such a manner that a periphery of the radiator plate portion of the jumper member attached to the selective energization portion may be surrounded by an insulating plate superimposed on the printed-circuit board. When configured in this manner, by surrounding the radiator plate portion of the jumper member with an insulating plate, the jumper member can exert both high-level heat dissipation and insulation abilities.

According to a further embodiment, the electrical connection box can be configured in such a manner that the selectively eatable portion includes a plurality of selectively cuttable portions, and the selective energization portion includes a plurality of selective energization portions. When configured in this manner, by selecting whether a plurality of the selectively cuttable portions are individually cut or left uncut, and by selecting whether the jumper member is individually attached or unattached to a plurality of the selective energization portions, it is possible to form a wider variety of bus bar circuits and printed wire circuits.

According to the exemplary embodiments of the internal circuit structural element for an electrical connection box provided herein, it is possible to form different types of bus bar circuits from the same bus bar by providing the selectively cuttable portion(s) to the bus bar, and by selecting whether the selectively cuttable portion(s) is/are cut or left uncut. Meanwhile, it is possible to form different types of printed wire circuits from the same printed-circuit board by providing the selective energization portion(s) obtained by dividing a printed wire on the printed-circuit board and by selecting whether the jumper member bridging across a divided portion of the printed wire is attached or unattached to the selective energization portion(s). Consequently, by combining different types of bus bar circuits and different types of printed wire circuits, it is possible to form a wide variety of circuit configurations in a cost-effective manner and while standardizing bus bars and printed-circuit boards. Also, according to the exemplary embodiments provided herein, because the internal circuit structural element configured as above can be used, it is possible to form a wide variety of internal circuits in a cost-effective manner.

DESCRIPTION OF THE EMBODIMENTS

Hereinafter, exemplary embodiments are described with reference to the drawings.

Figure 1:
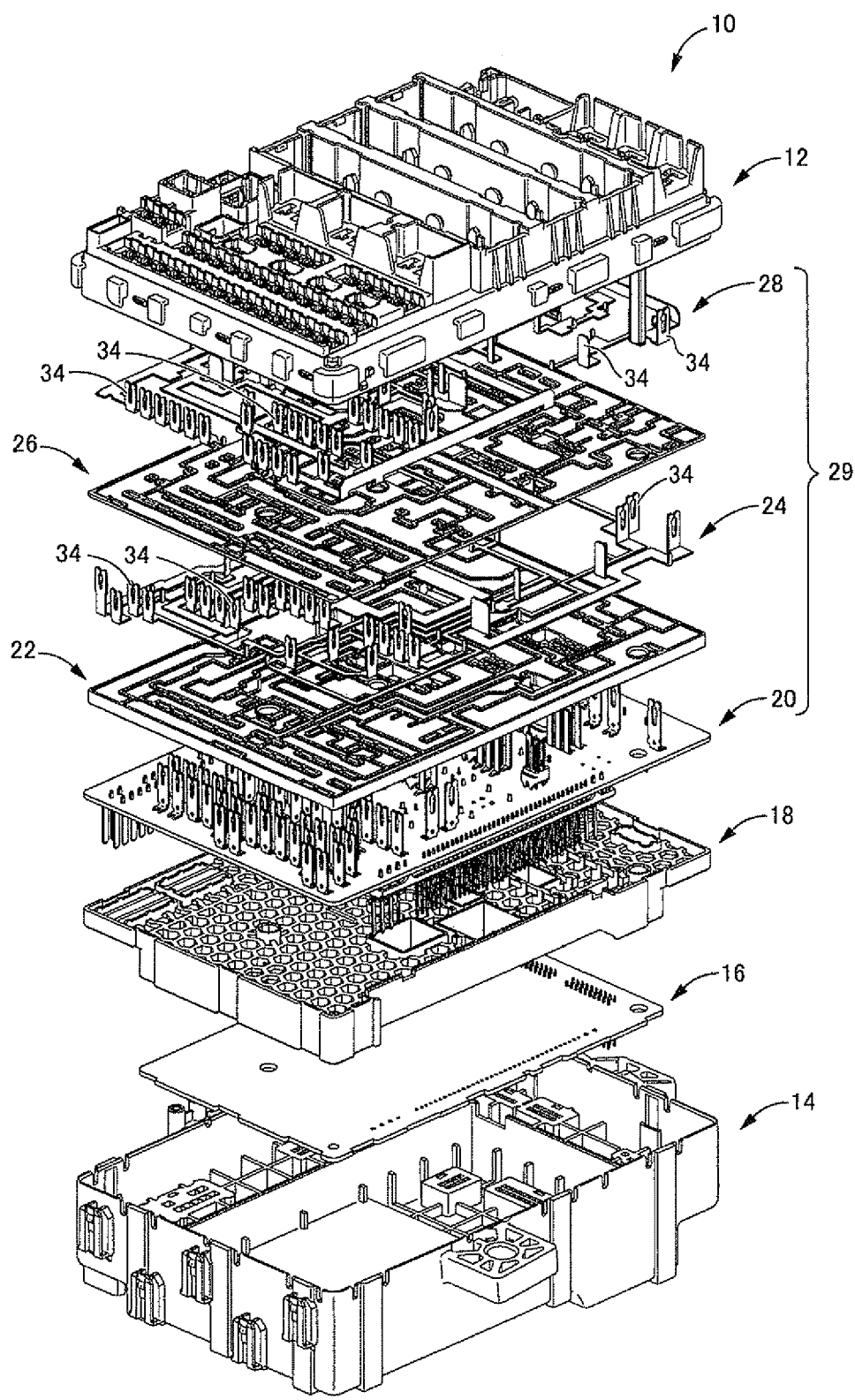
FIG. 1 is an exploded perspective view of an electrical connection box according to an exemplary embodiment.

FIG. 1 shows an electrical connection box 10 according to an exemplary embodiment. The electrical connection box 10 is a structure containing, between an upper case 12 and a lower case 14, a first printed-circuit board 16, a spacer 18 as an insulating plate, a second printed-circuit board 20 as a printed wire circuit structural element, a first bus bar insulating plate 22, a first bus bar 24 as a bus bar circuit structural element, a second bus bar insulating plate 26, and a second bus bar 28 as a bus bar circuit structural element laminated sequentially in this order from the side of the lower case 14. The second printed-circuit board 20, the first bus bar 24, and the second bus bar 28 together form an internal circuit structural element 29 according to an exemplary embodiment. An internal circuit of the electrical connection box 10 is formed using the internal circuit structural element 29.

Figure 2:
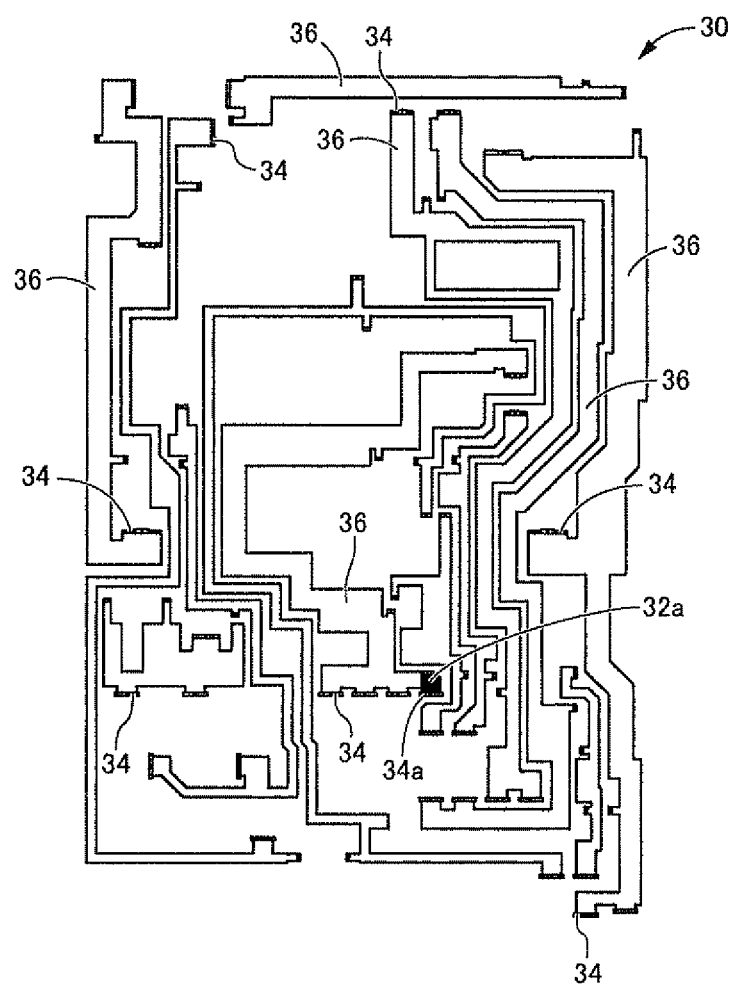
FIG. 2 is a bottom view of a bus bar intermediate body forming a first bus bar shown in FIG. 1.

The first bus bar 24 can be formed of a first bus bar intermediate body 30 as shown in FIG. 2. The first bus bar intermediate body 30 can be formed by pressing and punching out a metal plate. The first bus bar intermediate body 30 may be provided with a selectively cuttable portion 32a (indicated by a solid filled rectangle in FIG. 2 for ease of reference) and a terminal portion 34a may be provided at an end of the selectively cuttable portion 32a. The first bus bar intermediate body 30 may be punched out in a developed configuration before the terminal portions 34 appropriately provided to respective bus bar pieces 36 are bent. However, the respective terminal portions 34 are shown in a bent state in FIG. 2 and FIG. 4 to show a second bus bar intermediate body 38 as described below.

Figure 3A:
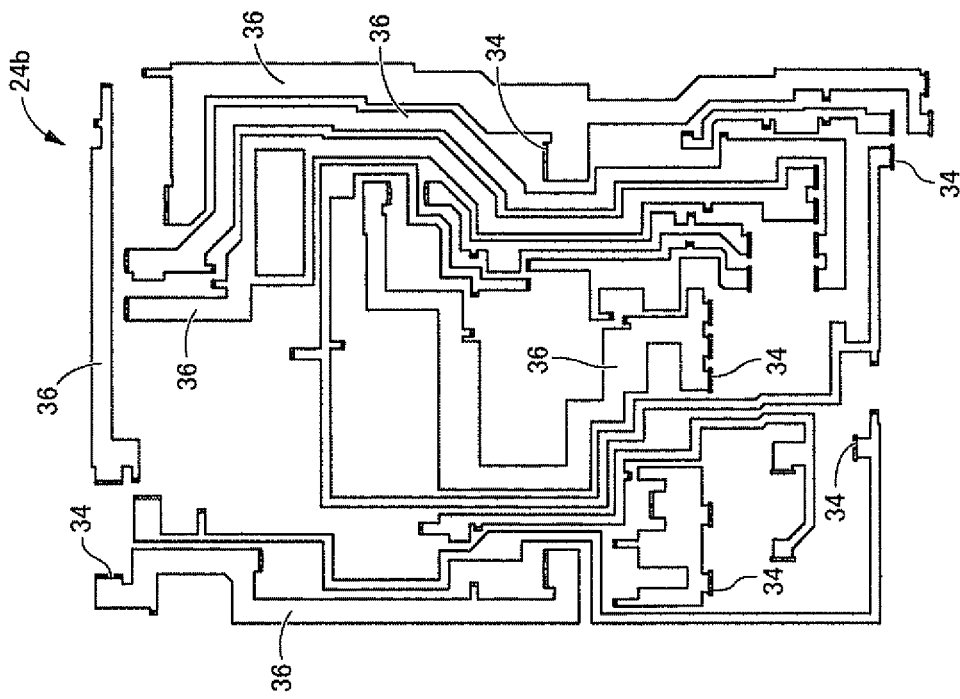
FIGS. 3A and 3B are bottom views of further examples of the first bus bar formed of the bus bar intermediate body shown in FIG. 2.
Figure 3B:
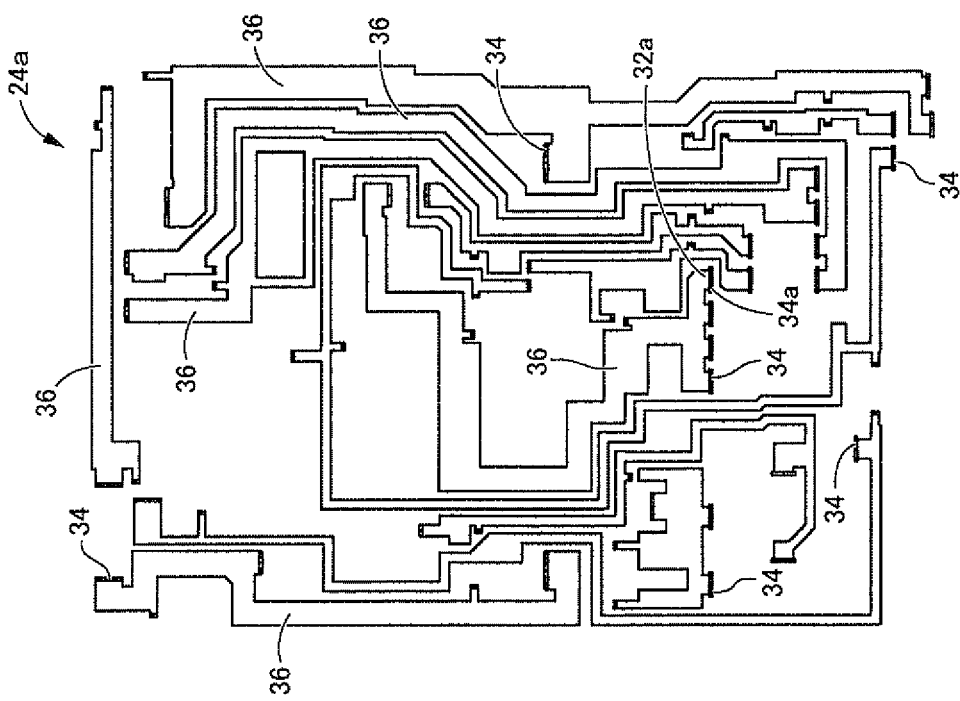

As is shown in FIG. 3A, a first bus bar 24a having the terminal portion 34a can be formed by leaving the selectively cuttable portion 32a of the first bus bar intermediate body 30 uncut. The electrical connection box 10 of this embodiment can adopt the first bus bar 24a. Alternatively, as is shown in FIG. 3B, a first bus bar 24b without a terminal portion 34a can be formed by cutting off the selectively cuttable portion 32a. In this manner, by selecting whether the selectively cuttable portion 32a is cut or left uncut, it is possible to obtain two types of first bus bars 24a and 24b having routing configurations that are different from each other from the same first bus bar intermediate body 30.

Figure 4:
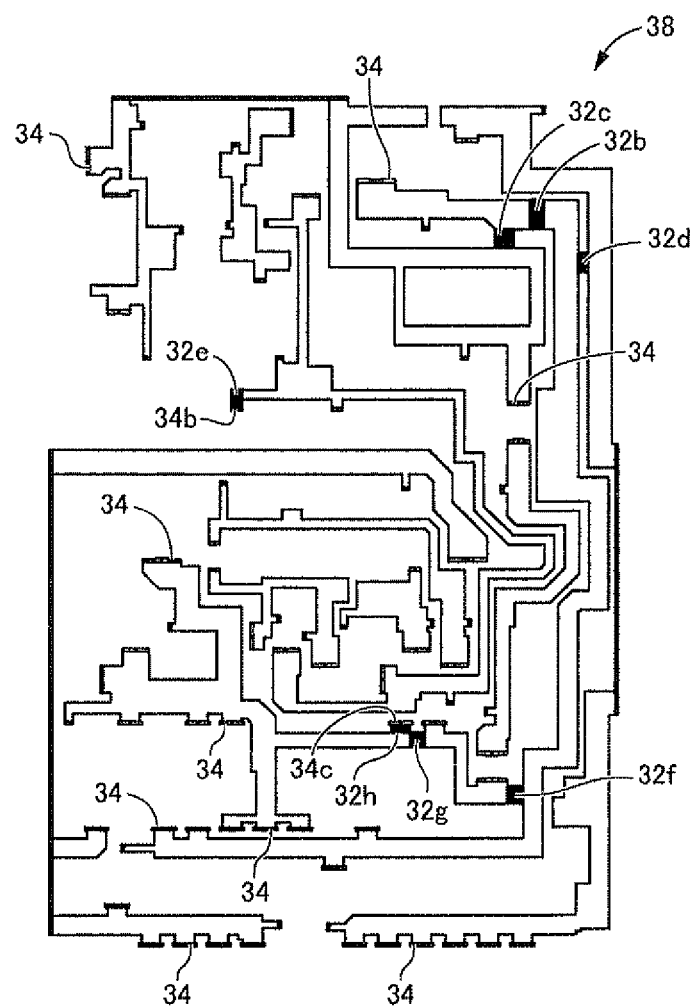
FIG. 4 is a bottom view of a bus bar intermediate body forming a second bus bar shown in FIG. 1.

Meanwhile, the second bus bar 28 may be formed of a second bus bar intermediate body 38 as shown in FIG. 4. The second bus bar intermediate body 38 can be formed by pressing and punching out a metal plate in a similar manner to the first bus bar intermediate body 30. The second bus bar intermediate body 38 may be provided with a plurality of selectively cuttable portions 32b through 32h (indicated by solid filled rectangles in FIG. 4 for ease of reference).

Figure 5A:
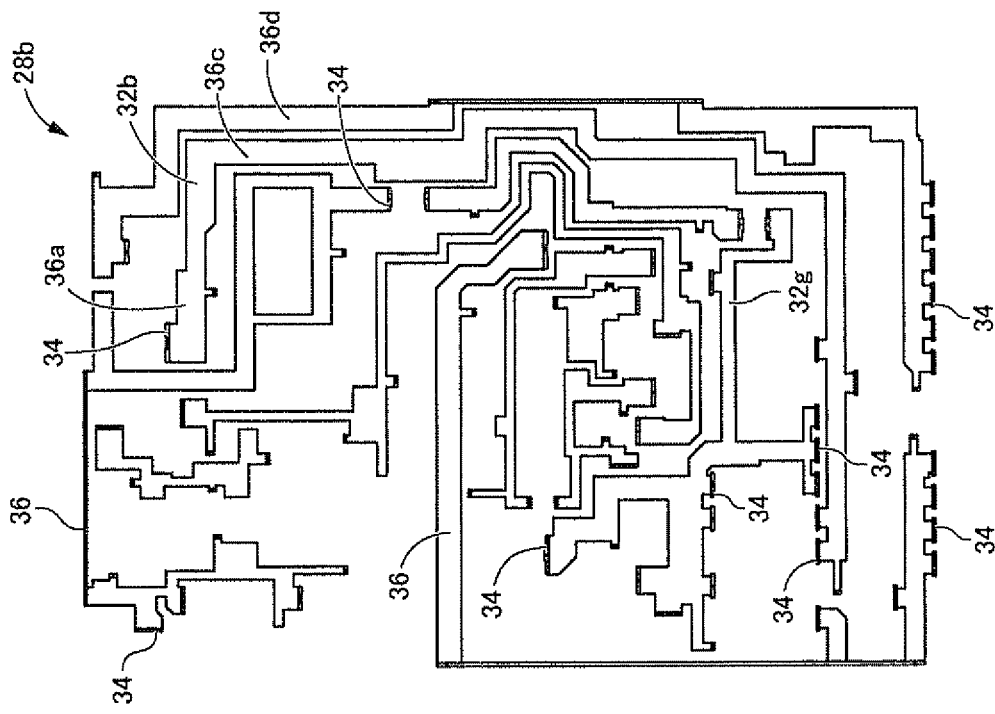
FIGS. 5A and 5B are bottom views of further examples of the second bus bar formed of the bus bar intermediate body shown in FIG. 4.
Figure 5B:
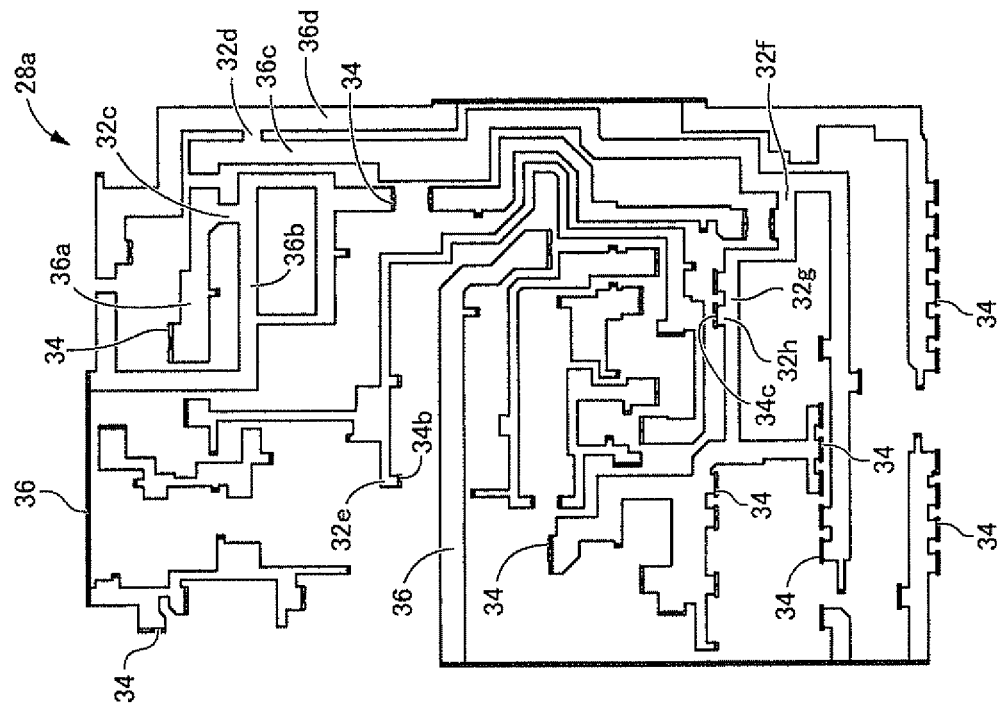

As is shown in FIG. 5A, a second bus bar 28a can be formed by cutting the selectively cuttable portion 32b of the second bus bar intermediate body 38. In the second bus bar 28a, because the selectively cuttable portion 32b is cut, a bus bar piece 36a can be connected to a bus bar piece 36b via the selectively cuttable portion 32c left uncut. The electrical connection box 10 of this embodiment can adopt the second bus bar 28a. Alternatively, as is shown in FIG. 5B, a second bus bar 28b can be formed by cutting the selectively cuttable portions 32c, 32d, 32e, 32f, and 32h of the second bus bar intermediate portion 38. In the second bus bar 28b, because the selectively cuttable portion 32c is cut, a bus bar piece 36a can be connected to a bus bar piece 36c via the selectively cuttable portion 32b left uncut. Also, because the selectively cuttable portion 32d is cut, the bus bar piece 36e and a bus bar piece 36d can be isolated. Further, because the selectively cuttable portions 32e and 32h are cut, terminal portions 34b and 34c provided at the ends of the selectively cuttable portions 32e and 32h, respectively, can be cut off. In this manner, by individually selecting whether the selectively cuttable portions 32b through 32h are cut or left uncut, it is possible to obtain the second bus bar 28a and the second bus bar 28b having circuit configurations different from each other from the same second bus bar intermediate body 38. By further changing a combination of the respective cut portions 32b through 32h as to which ones are cut and which ones are left uncut, the second bus bar 28 can be formed in a wide variety of routing configurations.

Figure 6:
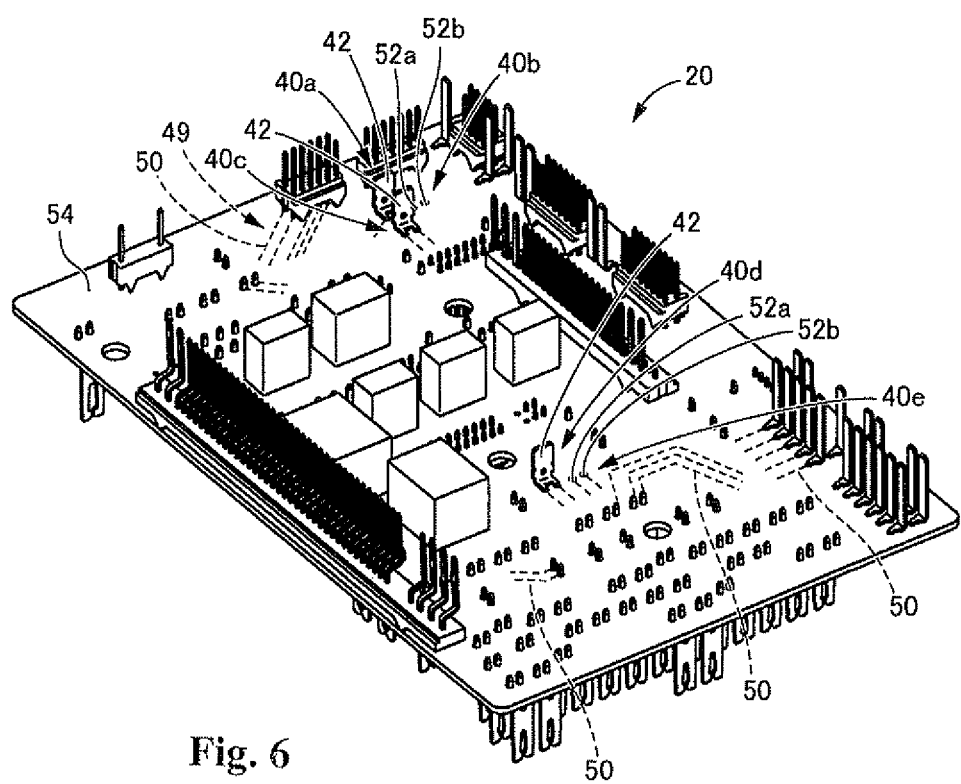
FIG. 6 is a perspective view of a second printed-circuit board shown in FIG. 1.
Figure 7:
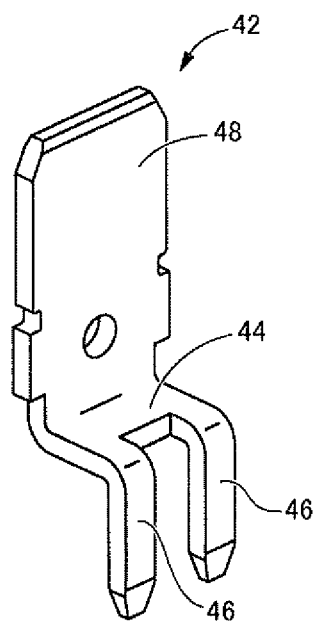
FIG. 7 is a perspective view of a jumper member.

FIG. 6 shows the second printed-circuit board 20. The second printed-circuit board 20 can be provided with a plurality of selective energization portions 40a through 40e. A jumper member 42 shown in FIG. 7 can be selectively attached to the selective energization portions 40a through 40e. The jumper member 42 can be formed by pressing and punching out a metal plate and bent like a crank as a whole. Accordingly, the jumper member 42 can have a flat plate portion 44 superimposed on the second printed-circuit board 20, a pair of conducting portions 46 in a shape of a protrusion piece protruding from one edge of the flat plate portion 44 in a direction substantially orthogonal to the flat plate portion 44, and a radiator plate portion 48 of a plate shape substantially as wide as the flat plate portion 44 and protruding from the other edge of the flat plate portion 44 on the opposite side inversely to the conducting portions 46 in a direction substantially orthogonal to the flat plate portion 44.

Figure 8B:
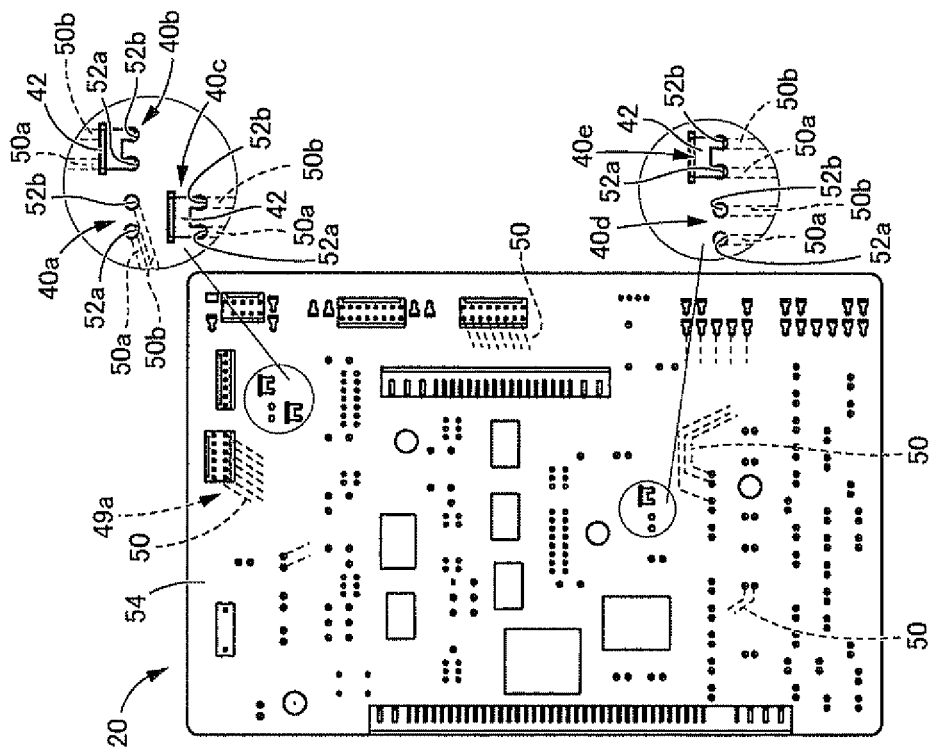
FIGS. 8A and 8B are top views illustrating exemplary attachments of the jumper members to selective energization portions.
Figure 8A:
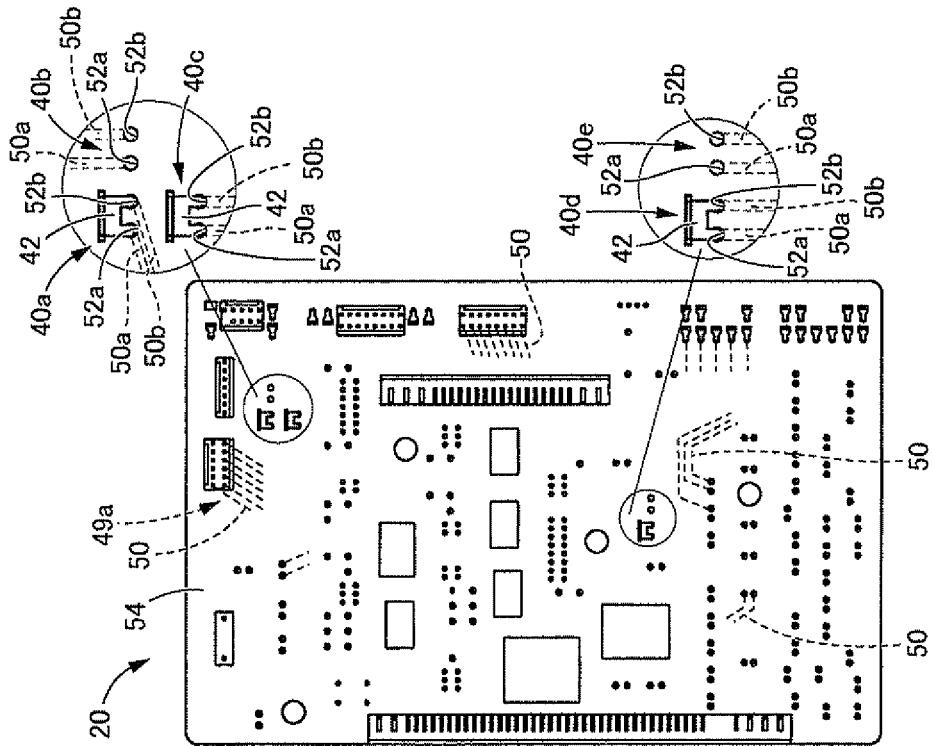

Because all of the selective energization portions 40a through 40e are of the same structure, they are hereinafter referred to as the "selective energization portion(s) 40" unless otherwise indicated. As shown in FIGS. 8A and 8B, the selective energization portions 40 are formed by dividing a printed wire 50 forming a printed wire circuit 49 provided on the second printed-circuit board 20. Through-holes 52a and 52b can be provided, respectively, to terminals of divided printed wires 50a and 50b at both ends. The printed wire 50 forming the selective energization portions 40 may be formed in the inside of the second printed-circuit board 20 or on the surface thereof. Because the second printed-circuit board 20 of this embodiment is a multi-layer printed-circuit board, the printed wire circuit 49 is formed in the inside.

As the conducting portions 46 of the jumper member 42 are inserted into the through-holes 52a and 52b of the selective energization portion 40 and soldered thereto, the jumper member 42 can be provided to bridge the divided printed wires 50a and 50b. Consequently, both printed wires 50a and 50b can be electrically connected to each other via the jumper member 42 and the selective energization portion 40 to which the jumper member 42 is attached to bring the selective energization portion 40 into an energized state. By selecting whether the jumper member 42 is individually attached or unattached to the selective energization portions 40a through 40e to set the respective selective energization portions 40a through 40e in an energized or de-energized state, it is possible to form a plurality of circuit routing configurations for the printed wire circuit 49 of the second printed-circuit board 20. For example, in the case of a printed wire circuit 49a of FIG. 8A, the selective energization portions 40a, 40c, and 40d can be energized because the jumper member 42 is attached to each of them, whereas the selective energization portions 40b and 40e can be de-energized because the jumper member 42 is not attached to them. The electrical connection box 10 of this embodiment can adopt the second printed-circuit board 20 provided with the printed wire circuit 49a. Alternatively, in the case of a printed wire circuit 49b as shown in FIG. 8B, the selective energization portions 40b, 40c, and 40e can be energized because the jumper member 42 is attached to each of them, whereas the selective energization portions 40a and 40d can be de-energized because the jumper member 42 is not attached to them. In other words, the second printed-circuit board 20 can be set to two types, the printed wire circuits 49a and 49b, by selectively attaching the jumper member 42 to either the selective energization portion 40a or the selective energization portion 40b, or either the selective energization portion 40d or the selective energization portion 40e.

Figure 9:
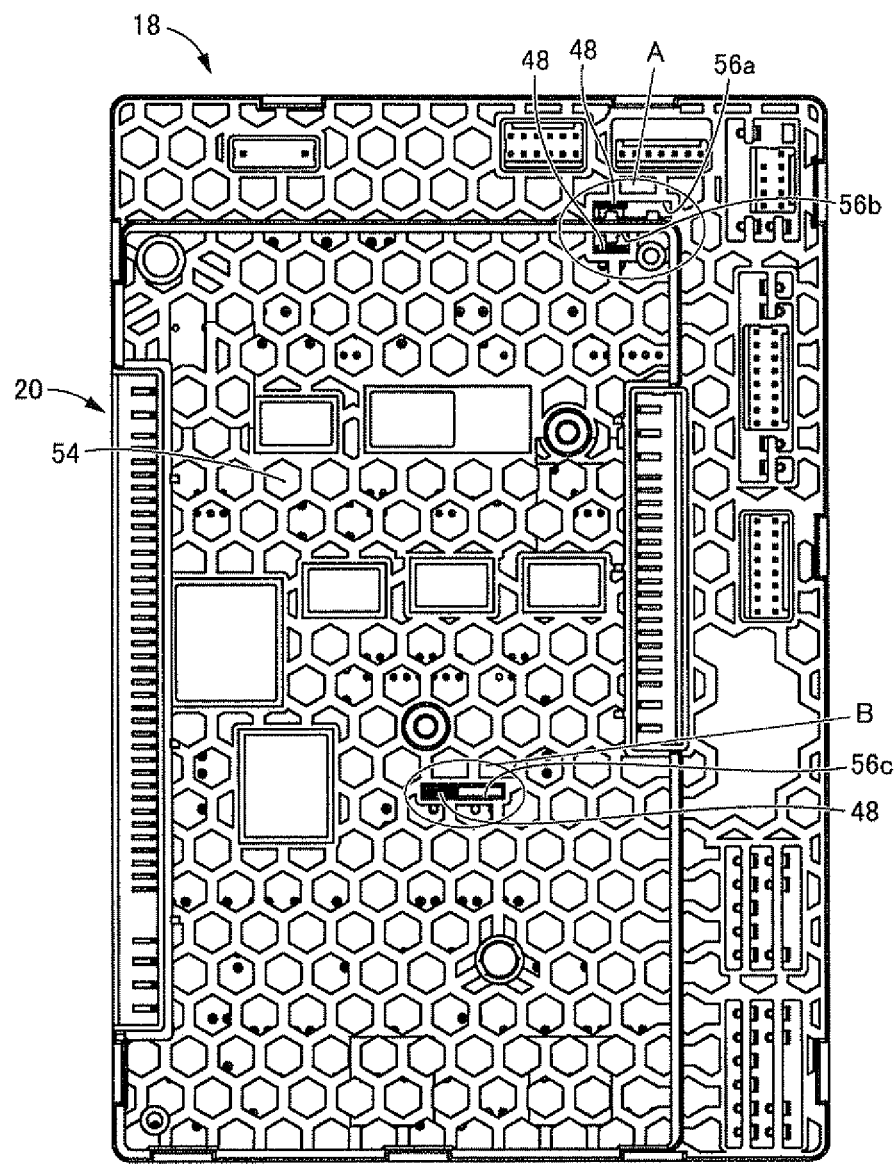
FIG. 9 is a bottom view showing a state where an insulating plate is superimposed on the second printed-circuit board shown in FIG. 6.
Figure 10:
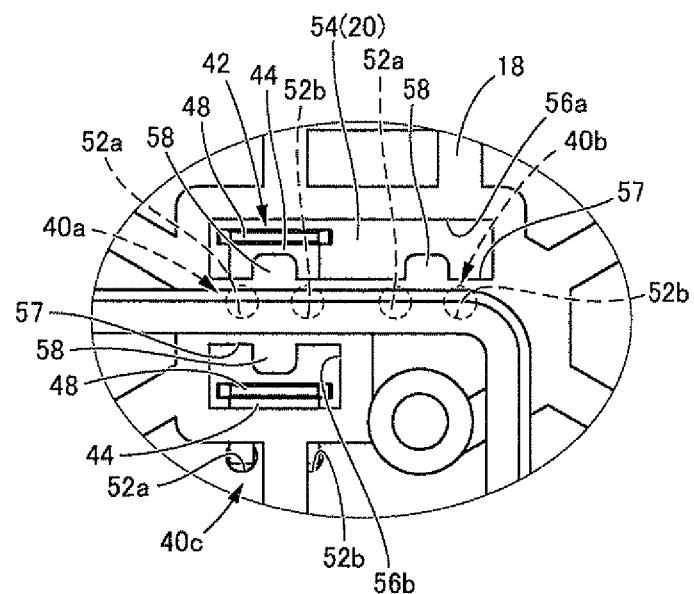
FIG. 10 is an enlarged view of a portion A of FIG. 9.
Figure 11:
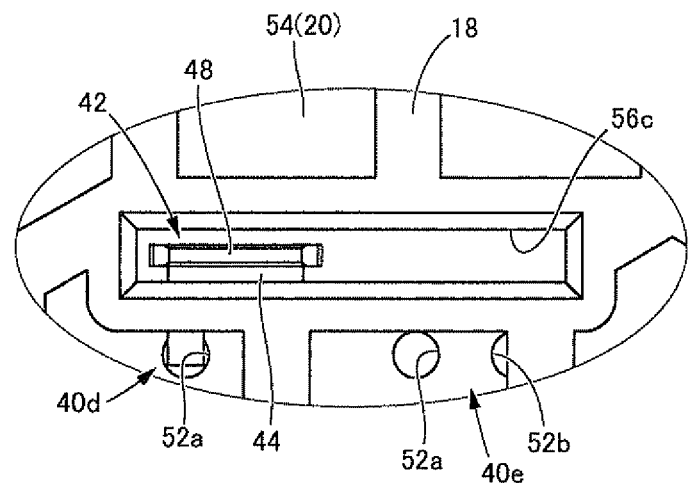
FIG. 11 is an enlarged view of a portion B of FIG. 9.

As is shown in FIG. 9, the spacer 18 can be superimposed on a surface 54 of the second printed-circuit board 20 onto which the jumper members 42 are attached. The spacer 18 can be made of non-conductive synthetic resin and shaped like a plate of a size large enough to be superimposed on substantially the entire surface of the second printed-circuit board 20. The spacer 18 may be provided with radiator insertion holes 56a through 56c penetrating through the spacer 18. As shown in FIG. 10 and FIG. 11, the radiator insertion holes 56a through 56c may be rectangular through-holes. The radiator insertion holes 56a and 56c may be, respectively, of a size across the selective energization portions 40a and 40b and of a size across the selective energization portions 40d and 40e, and both may be large enough to contain the two radiator plate portions 48 arranged side-by-side. Meanwhile, the radiator insertion hole 56b may be of a size across the selective energization portion 40c large enough to accommodate one radiator plate portion 48. A width dimension of the radiator insertion holes 56a and 56b (a dimension from top to bottom in FIG. 10) may be slightly larger than a width dimension of the radiator insertion hole 56c (i.e., a dimension from top to bottom in FIG. 11). Protrusions 58 protruding inward may be provided to the respective radiator insertion holes 56a and 56b on the inner peripheral surfaces 57 at positions in close proximity to the respective selective energization portions 40a, 40b, and 40c. Owing to these protrusions 58, an actual spacing distance between the radiator insertion holes 56a and 56b with a larger width dimension and the radiator plate portions 48 may be set substantially equal to a spacing distance between the radiator insertion hole 56c with a smaller width dimension and the radiator plate portion 48, thereby preventing the radiator plate portions 48 from falling over.

As the spacer 18 is superimposed on the surface 54 of the second printed-circuit board 20, the radiator plate portion 48 of the jumper member 42 attached to the selective energization portion 40a can be inserted into the radiator insertion hole 56a and the periphery of the radiator plate portion 48 can be surrounded by the spacer 18. Likewise, the radiator plate portions 48 of the jumper members 42 attached to the respective selective energization portions 40c and 40d can be inserted into the radiator insertion holes 56b and 56c, respectively, and the periphery of each can be surrounded by the spacer 18. It should be noted that the respective radiator plate portions 48 can be inserted into the radiator insertion holes 56a through 56c while being spaced apart all along their circumferences.

As shown in FIG. 1, as the first bus bar 24, the second bus bar 28, and the second printed-circuit board 20 are contained between the upper case 12 and the lower case 14, the bus bar circuit formed of the first and second bus bars 24 and 28 and the printed wire circuit 49 provided to the second printed-circuit board 20 together form an internal circuit of the electrical connection box 10. In this manner, the internal circuit structural element 29 including the first bus bar 24, the second bus bar 28, and the second printed-circuit board 20 can be formed.

According to the internal circuit structural element 29 having the structure of this embodiment, by selecting whether the respective selectively cuttable portions 32a through 32h provided to the first bus bar intermediate body 30 forming the first bus bar 24 and the second bus bar intermediate body 38 forming the second bus bar 28 are cut or left uncut, it is possible to set different types of routing configurations of the first bus bar 24 and the second bus bar 28. Also, by selecting whether the jumper members 42 are attached or unattached to the respective selective energization portions 40a through 40e provided to the second printed-circuit board 20, it is possible to set different types of routing configurations of the printed wire circuit 49 of the second printed-circuit board 20. Consequently, by combining different types of routing configurations of the bus bar circuit formed of the first and second bus bars 24 and 28, and different types of routing configurations of the printed wire circuit 49 of the second printed-circuit board 20, it is possible to form a wide variety of circuit configurations while reducing costs by standardizing the first bus bar intermediate body 30, the second bus bar intermediate body 38, and the second printed-circuit board 20.

The jumper member 42 attached to the selective energization portion 40 of the second printed-circuit board 20 can be provided with the radiator plate portion 48. Accordingly, the jumper member 42 can function to dissipate heat, and the selective energization portion 40 can become operable on a large current. Also, because it is easier to change the configuration of the printed wire circuit 49 than the first bus bar 24 and the second bus bar 28, by forming a large current circuit on the side of the printed wire circuit 49, the routing configuration of the large current circuit can be readily changed.

Further, the radiator plate portion 48 of the jumper member 42 attached to the selective energization portion 40 can be inserted into the radiator insertion hole 56 in the spacer 18 such that it is surrounded by the spacer 18 all along its periphery. Owing to this configuration, the jumper member 42 can exert both a high-level insulating ability and a heat dissipation effect. Also, because the jumper member 42 can be readily held by pinching the radiator plate portion 48 of a plate shape, handling when attached to the selective energization portion 40 can be enhanced. Further, because the jumper member 42 can be shaped like a crank, the jumper member 42 can be allowed to stand by itself by superimposing the flat plate portion 44 on the second printed board 20, additionally enhancing soldering workability.

While exemplary embodiments have been described above, this disclosure is not limited to the specific description set forth herein. For example, a double-layer bus bar circuit can be formed using the first bus bar 24 and the second bus bar 28 in the embodiment above. However, the bus bar circuit may be a mono-layer bus bar circuit or a multi-layer bus bar circuit comprised of three or more layers. In a case where the bus bar circuit is formed using two or more layers, it may be sufficient to provide the selectively cuttable portions to at least one of the layers.

The jumper members 42 of the embodiment above are shown shaped like a crank. However, the jumper members 42 may be shaped like a flattened plate without being bent like a crank, among other shapes. Further, the radiator plate portions of the jumper members are not necessarily required when setting the selective conductive portions provided on the printed wire circuit in an energized or de-energized state. For example, jumper members formed by bending a metal wire in a U shape may be used in an alternate arrangement.

What is claimed is:

1. An internal circuit structural element for an electrical connection box having an internal circuit that includes a bus bar circuit and a printed wire circuit of a printed-circuit board, the structural element comprising:
   a bus bar circuit structural element including a bus bar with a selectively cuttable portion, the bus bar being configured to be formed into different types of routing configurations based on modification of the selectively cuttable portion;
   a printed wire circuit structural element including the printed-circuit board with a selective energization portion, the printed circuit board including a plurality of portions of a printed wire that are configured to form different types of routing configurations of the printed wire circuit through attachment of one or more jumper members configured to bridge across a divided portion of the printed wire to the selective energization portion, wherein:
   the one or more jumper members include a pair of conducting portions respectively connected to terminals at both ends of the selectively cuttable portion of the printed wire in the selective energization and a radiator plate portion of a plate shape; and
   a periphery of the radiator plate portion of the jumper member attached to the selective energization portion is surrounded by an insulating plate superimposed on the printed-circuit board.

2. The electrical connection box comprising the internal circuit that includes the bus bar circuit and the printed wire circuit of the printed-circuit board, wherein
   the internal circuit is formed from the internal circuit structural element set forth in claim 1 by:
   cutting the selectively cuttable portion of the bus bar circuit structural element to form the bus bar circuit; and
   attaching the one or more jumper members to the selective energization portion of the printed wire circuit structural element to form the printed wire circuit.

3. The electrical connection box according to claim 2, wherein:
   the selectively cuttable portion includes a plurality of selectively cuttable portions and the selective energization portion includes a plurality of selective energization portions.

4. The electrical connection box according to claim 2, further comprising:
   a second bus bar circuit and a second printed wire circuit, each disposed in a stacked arrangement with the bus bar circuit and the printed wire circuit.

* * * * *